United States Patent
Harvey

(10) Patent No.: US 10,330,758 B2
(45) Date of Patent: Jun. 25, 2019

(54) MAGNETIC RESONANCE IMAGING USING ZERO ECHO TIME PUSE SEQUENCES

(71) Applicant: KONINKLIJKE PHILIPS N.V., Eindhoven (NL)

(72) Inventor: Paul Royston Harvey, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 456 days.

(21) Appl. No.: 15/039,461

(22) PCT Filed: Oct. 27, 2014

(86) PCT No.: PCT/EP2014/072956
§ 371 (c)(1),
(2) Date: May 26, 2016

(87) PCT Pub. No.: WO2015/082128
PCT Pub. Date: Jun. 11, 2015

(65) Prior Publication Data
US 2017/0003364 A1    Jan. 5, 2017

(30) Foreign Application Priority Data

Dec. 2, 2013 (EP) .................................. 13195227

(51) Int. Cl.
*G01R 33/58* (2006.01)
*G01R 33/48* (2006.01)
*G01R 33/385* (2006.01)

(52) U.S. Cl.
CPC ....... *G01R 33/4816* (2013.01); *G01R 33/385* (2013.01); *G01R 33/58* (2013.01)

(58) Field of Classification Search
CPC ............ G01R 33/4816; G01R 33/4826; G01R 33/4641
(Continued)

(56) References Cited

U.S. PATENT DOCUMENTS 4,833,407 A * 5/1989 Holland ................. G01R 33/56
                                                                324/309
4,970,457 A * 11/1990 Kaufman ......... G01R 33/56563
                                                                324/307
(Continued)

FOREIGN PATENT DOCUMENTS

DE        10156770 A1    7/2002
WO      2013001399 A2    1/2013

OTHER PUBLICATIONS

Weiger et al "MRI with Zero Echo Time: Hard Versus Sweep Pulse Excitation" Mag. Reson. Med. Mar. 4, 2011 vol. 66 No. 2 p. 379-389.
(Continued)

*Primary Examiner* — Patrick Assouad
*Assistant Examiner* — Demetrius R Pretlow

(57) ABSTRACT

The invention provides for a magnetic resonance imaging system (100) comprising: a magnet (104) for generating a main magnetic field with an imaging zone (110), and a gradient coil system (110, 112). The gradient coil system comprises a set of unshielded gradient coils (110). The magnetic resonance imaging system further comprises a processor (130) for controlling the magnetic resonance imaging system. Execution of the instructions stored in a memory cause the processor to: acquire (200, 304) imaging magnetic resonance data (152) from a volume (109) within the imaging zone using a zero echo time pulse sequence; reconstruct (202, 306) a three-dimensional image (156) using the imaging magnetic resonance data; subtract a calibration image from the three-dimensional image, the calibration image having been acquired without a subject in the imaging zone; and render the three-dimensional image on a display by projecting it on a two-dimensional plane.

10 Claims, 3 Drawing Sheets

(58) Field of Classification Search
USPC .......................................................... 324/322
See application file for complete search history.

(56) References Cited

U.S. PATENT DOCUMENTS

| | | | | |
|---|---|---|---|---|
| 5,587,658 | A * | 12/1996 | Sukumar | G01R 33/3875 324/307 |
| 5,742,163 | A * | 4/1998 | Liu | G01R 33/56554 324/307 |
| 6,700,374 | B1 * | 3/2004 | Wu | G01R 33/56554 324/306 |
| 7,205,766 | B2 | 4/2007 | Miyamoto | |
| 7,821,267 | B2 | 10/2010 | Yatsui et al. | |
| 2004/0119472 | A1 | 6/2004 | Laskaris et al. | |
| 2004/0135578 | A1 * | 7/2004 | Peters | G01R 33/56545 324/309 |
| 2009/0201021 | A1 * | 8/2009 | Jellus | G01R 33/4828 324/309 |
| 2012/0074941 | A1 | 3/2012 | Grodzki | |
| 2014/0086468 | A1 * | 3/2014 | Grodzki | G01R 33/565 382/131 |

OTHER PUBLICATIONS

Weiger et al "High Resolution ZTE Imaging of Human Teeth" NMR Biomed 2012, V. 25, p. 1144-1151 Jan. 31, 2012.
Madio et al "Ultra-Fast Imaging Using Low Flip Angles and FIDS" Magnetic Resonance in Medicine, vol. 34, No. 4, Oct. 1, 1995 p. 525-539.
Hafner et al "Fast Imaging in Liquids and Solids with Back-Projection Low Angle Shot Technique" Magnetic Resonance Imaging, vol. 12, No. 7 Jan. 1, 1994, p. 1047-1051.
Wu et al "Evaluation of Bone Mineral Density Using Three Dimensional Solid State Phosphorus-31 NMR Projection Imaging" Calcified Tissue International vol. 62, No. 6, Jun. 1, 1998 p. 512-518.
Heid et al "A Novel Concept for Gradient Coil and Magnetic Integration" Proc. Intl. Soc. Mag. Reson. Med. vol. 13, Jan. 1, 2005 p. 895.
Littin et al "Planar Gradient System for Imaging with Non-Linear Gradients" Proc. Intl. Soc. Mag. Reson. Med. 19, Jan. 1, 2011, p. 1837.
Borceto et al "Distortion of Gradient Coils Performances in Presence of Iron" Proc. Intl. Soc. Mag. Reson. Med. 19, Jan. 1, 2011 p. 722.
Sanchez et al "Gradient Coil Design Using Quadratic Programming with Relaxed Target Field" Proc. Intl. Soc. Mag. Reson. Med. 11, vol. 1, Jan. 1, 2004 p. 2415.
Matsuda et al "Development of Multi-Channel Gradient Probe for Super-Parallel MR Microscope" Proc. Intl. Soc. Mag. Reson. Med 9, Jan. 1, 2001 p. 1142.
Slade et al "Test Results for a 1.5 T MRI System Utilizing a Cryogen-Free YBCO Magnet" IEEE Transactions on Applied Superconductivity IEEE Service Center vol. 24, No. 3, Oct. 7, 2013.
Anonymous Gyroscan Intera Application Guide, Release 9, vol. 2, Scan Methods, May 30, 2002 p. 223-231.
Anonymous Gyroscan NT Release 6, vol. 2, Scan Methods, 1998, p. 175-179.
Weiger et al "ZTE Imaging in Humans" Magnetic Resonance in Med. vol. 70 p. 328-332 (2013).

* cited by examiner

MAGNETIC RESONANCE IMAGING USING ZERO ECHO TIME PUSE SEQUENCES

CROSS REFERENCE TO RELATED APPLICATIONS

This application is a U.S. national phase application of International Application No. PCT/EP2014/072956, filed on Oct. 27, 2014, which claims the benefit of EP Application Serial No. 13195227.7 filed on Dec. 2, 2013 and is incorporated herein by reference.

TECHNICAL FIELD

The invention relates to magnetic resonance imaging, in particular to zero echo time pulse sequences.

BACKGROUND OF THE INVENTION

Chest X-rays are typically used to diagnose active Tuberculosis. In developing countries such as India, people at risk may have their lungs x-rayed several times per year. However, exposure to X-rays increases a person's chances of developing cancer.

The imaging of bone using so called zero echo time or ultra short echo time pulse sequences is known. The journal articles Weiger et. al., "MRI with Zero Echo Time: Hard versus Sweep Pulse Excitation," Magn Reson Med. 2011 August; 66(2):379-89, doi: 10.1002/mrm.22799 and Wieger et. al., "High-resolution ZTE imaging of human teeth," NMR Biomed. 2012, v. 25, pp. 1144-1151, DOI: 10.1002/nbm.2783 disclose some applications of the zero echo time pulse technique.

SUMMARY OF THE INVENTION

The invention provides for a magnetic resonance imaging system and a user interface in the independent claims. Embodiments are given in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wireline, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins by the antenna of a Magnetic resonance apparatus during a magnetic resonance imaging scan. Magnetic resonance data is an example of medical image data. A Magnetic Resonance Imaging (MRI) image is defined herein as being the reconstructed two or three dimensional visualization of anatomic data contained within the magnetic resonance imaging data. This visualization can be performed using a computer.

In one aspect the invention provides for a magnetic resonance imaging system as defined in claim 1. The present invention aims at providing an magnetic resonance examination system that functions in a very simple manner similarly to a projection x-ray imager. The invention achieves this by the combined technical effects of various features. Namely, the use of an unshielded gradient allows an inexpensive construction. The of a ZTE acquisition sequence combines sensitivity for hard tissue types with a simultaneous volumetric acquisition of the magnetic resonance signal. Projection of the reconstructed 3D image onto a two-dimensional plane involves an averaging which achieves good diagnostic image quality even with the use of unshielded gradients to generated the encoding gradient magnetic fields. Further, single control element is provided for activating the acquisition of the magnetic resonance imaging data. This co-operates with the use of the ZTE acquisition sequence which does not require configuration on the part of the user. The magnetic resonance imaging system comprises a magnet for generating a main magnetic field with an imaging zone. The magnetic resonance imaging system further comprises a gradient coil system for generating a gradient magnetic field within the imaging zone. The gradient coil system comprises a set of unshielded gradient coils operable for generating the gradient magnetic field. A set of unshielded gradient coils may refer to gradient coils for producing gradients in the x, y and z directions. This may also be understood to be gradient coils for producing three orthogonal sets of gradient fields.

A shielded gradient coil is a gradient coil which has additional windings for reducing the gradient fringe field inside of the magnetic or cryostat of the magnet. For example U.S. Pat. No. 5,296,810 describes one way type of shielded gradient coils.

An unshielded gradient coil is a gradient coil which lacks these additional windings to reduce the magnetic field within the magnet or cryostat. The magnetic resonance imaging system further comprises a memory for storing machine-executable instructions and pulse sequence data. The pulse sequence data is descriptive of a zero echo time magnetic resonance imaging method. The pulse sequence contains either instructions or data or information which may be used to create instructions for controlling the magnetic resonance imaging system to perform the zero echo time magnetic resonance imaging method. The magnetic resonance imaging system further comprises a processor for controlling the magnetic resonance imaging system. Execution of the instructions causes the processor to acquire imaging magnetic resonance data from a volume within the imaging zone using the zero echo time pulse sequence data. The volume may also be referred to as a field of view. Execution of the instructions further causes the processor to reconstruct a three-dimensional image using the imaging magnetic resonance data. Execution of the instructions further causes the processor to render at least a portion of the three-dimensional image on a display.

This embodiment may be beneficial because the use of the unshielded gradient coils enable the magnetic resonance imaging system to be constructed more inexpensively. The use of shielded gradient coils is standard on modern magnetic resonance imaging equipment. The use of shielded gradient coils is also important to the paradigm of acquiring magnetic resonance data by slices or particular regions within a subject. A zero echo time pulse sequence acquires the data for an entire volume at the same time.

In some examples the display could be a portion or part of the magnetic resonance imaging system such as a monitor or other display. In other examples the display is a display on a separate object. For instance a tablet computer or a mobile telephone could be used for the display. In some examples there may be an app or application which is installed onto a tablet or mobile telephone device for displaying and/or controlling the magnetic resonance imaging system. The above embodiment may also be beneficial because the rendering of the three-dimensional image on a display may be used as a substitute for an X-ray. It may not be obvious to the skilled person to use unshielded gradient coils because unshielded gradient coils are not suitable for use for modern magnetic resonance imaging protocols.

In another embodiment the three-dimensional data is rendered by projecting the three-dimensional image onto the at least one two-dimensional plane. This embodiment may be beneficial because the projection of the three-dimensional image may be used in a way similar to an X-ray. This has the benefit of reducing the amount of radiation that an individual is exposed to. Also the projecting of the three-dimensional image onto the two-dimensional plane has good signal-to-noise benefit. There is an averaging effect in the image and this enables good image quality even with the use of unshielded gradient coils. The three-dimensional image could be projected onto more than one plane. This is beneficial in comparison to a normal X-ray because a single data acquisition may be used to make projections in different planes. It may also be beneficial to display more than one two-dimensional plane at the same time. For example planes that are orthogonal to each other could be displayed.

In another embodiment the magnetic resonance imaging system comprises a user interface with a single control element operable for activating the acquisition of the magnetic resonance data. The single control element could for instance be a button or other control on a surface of the magnetic resonance imaging system. The single control element could also be a control element or control in a graphical user interface displayed on a display. This embodiment is beneficial because the use of a zero echo time pulse sequence requires no configuration on the part of the user. For instance a relatively unskilled individual could put a subject into the imaging zone and then simply activate the magnetic resonance imaging system to acquire the imaging magnetic resonance data. This for instance may be useful in remote clinics where doctors or skilled technicians are not always available.

In another embodiment the user interface further comprises a field of use selector for adjusting the gradient magnetic field to contract or expand the field of view. It is possible to change the field of view displayed by simple cropping or imaging processing techniques. It is also possible to adjust the field of view by adjusting the gradients produced by the unshielded gradient coils. This may be accomplished by changing the duration of the gradient fields generated by the unshielded gradient coils or else by changing the amplitude of the magnetic field generated by the unshielded gradient coils.

The view selector could for instance be a mechanical selector to select between a predetermined number of gradient settings or in another example the view selector may be a selector on a graphical user interface.

In another embodiment execution of the instructions further cause the processor to subtract or can convolve a calibration image from the three-dimensional image before rendering the at least a portion of the three-dimensional image on the display. When using a zero echo time pulse sequence plastics or other materials used for constructing the magnetic resonance imaging system may in some instances be imaged on the magnetic resonance imaging system. A calibration image herein encompasses an image acquired with a magnetic resonance imaging system that is acquired without a subject being within the magnetic resonance imaging system. This may be a straight forward and easy way of removing artifacts from the three-dimensional image. This may be particularly true in the case when there is folding within the image.

In another embodiment execution of the instructions further cause the processor to acquire calibration magnetic resonance data from the volume within the imaging zone using the zero echo time pulse sequence. The magnetic resonance imaging system is operable to acquire the calibration magnetic resonance data without a subject in the imaging zone. Execution of the instructions further causes the processor to reconstruct the calibration image using the calibration magnetic resonance data. This for instance may be accomplished by the same method in which the three-dimensional image is reconstructed.

In another embodiment the processor is operable to acquire the calibration magnetic resonance data before or after acquiring the imaging magnetic resonance data. For instance in a situation where a subject has been imaged and then the operator notices that there are artifacts in the image it is possible to perform the calibration after the subject has already been imaged. So essentially this calibration can be performed before or after the imaging magnetic resonance data is acquired.

In another embodiment the magnet is operable for supporting a thorax of a subject into the imaging zone. This embodiment may be beneficial because the magnetic resonance imaging system may be used as a substitute for taking an X-ray of a subject's lungs. This for instance may be useful in trying to detect tuberculosis or other lung infection. In comparison to conventional X-ray machines the subject is exposed to less radiation. In comparison to conventional magnetic resonance imaging systems the magnetic resonance imaging system of this embodiment will cost less to construct because the unshielded gradient coils are used in place of shielded gradient coils.

In another embodiment the magnet is operable for supporting a portion of an extremity within the imaging zone. This embodiment may be beneficial because for instance an arm, leg or other extremity can be placed into the magnet and the rendering of at least a portion of the three-dimensional image on the display may be used in place of a conventional X-ray.

In another embodiment the magnet is a cylindrical magnet with a bore. The imaging zone is within the bore. The bore in one example has a diameter less than 25 cm. In another example the bore has a diameter of being less than or equal to 15 cm. This embodiment may be useful because other objects such as fruit or manufactured objects may be placed in the magnetic resonance imaging system and examined. The use of a small bore in combination with the unshielded gradient coils means that the magnetic resonance imaging system can be constructed very inexpensively in comparison to a normal magnetic resonance imaging system.

In another embodiment the gradient coil system comprises a gradient coil power supply for supplying current to the set of unshielded gradient coils. The slew rate of the unshielded gradient coil is in one example less that 10 T m/s or less than 1 T m/s. The power requirements of the gradient coil power supply when the slew rate is less than or equal to 10 T m/s is less than or equal to 10 kVA. In another example where the slew rate of the power supply is equal or less than 1 T m/s the power supply requirements are 5 kVA. This embodiment may be beneficial because the use of a less powerful power supply in comparison to conventional magnetic resonance imaging systems means that it will be less expensive. Additionally the magnetic resonance imaging system may be used in regions where the power supply is comparatively poor. For instance in developing countries which have a less reliable power grid.

In another embodiment the magnet is operable for generating the main magnetic field in the imaging zone with a field strength less than or equal to any one of the following: 0.5 T, 1 T, and 1.5 T. The use of these magnetic fields may be beneficial because although the signal-to-noise ratio in the images is worse as the field decreases the technique of projecting the data onto a two-dimensional screen means that there is still relatively large signal-to-noise which enables a physician or other operator to correctly interpret the image.

In another embodiment the user interface is operable for selecting a slice of the three-dimensional data to render on the display.

This embodiment may be beneficial because it may enable a healthcare provider to view a particular region of the subject in more detail. This is not possible with conventional X-ray machines.

In another embodiment the zero echo time pulse sequence data causes the processor to generate a series of constant gradient magnetic fields using the gradient coil system for radial center-out k-space encoding. Execution of the instructions further causes the processor to generate a block radio-frequency pulse corresponding to each of the series of constant gradient magnetic fields. In some examples having the radio-frequency pulse correspond to each of the series of the constant gradient magnetic fields may mean that the radio-frequency pulse is performed during a portion of each of the series of constant gradient magnetic fields. Execution of the instructions further cause the processor to measure a portion of the imaging magnetic resonance data after the block radio-frequency pulse.

In another aspect the invention provides for a user interface for a magnetic resonance imaging system comprising a single control element operable for activating the acquisition of the magnetic resonance data. In this example the user interface may be connected to the above described features of the magnetic resonance imaging system to enable it to function properly.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
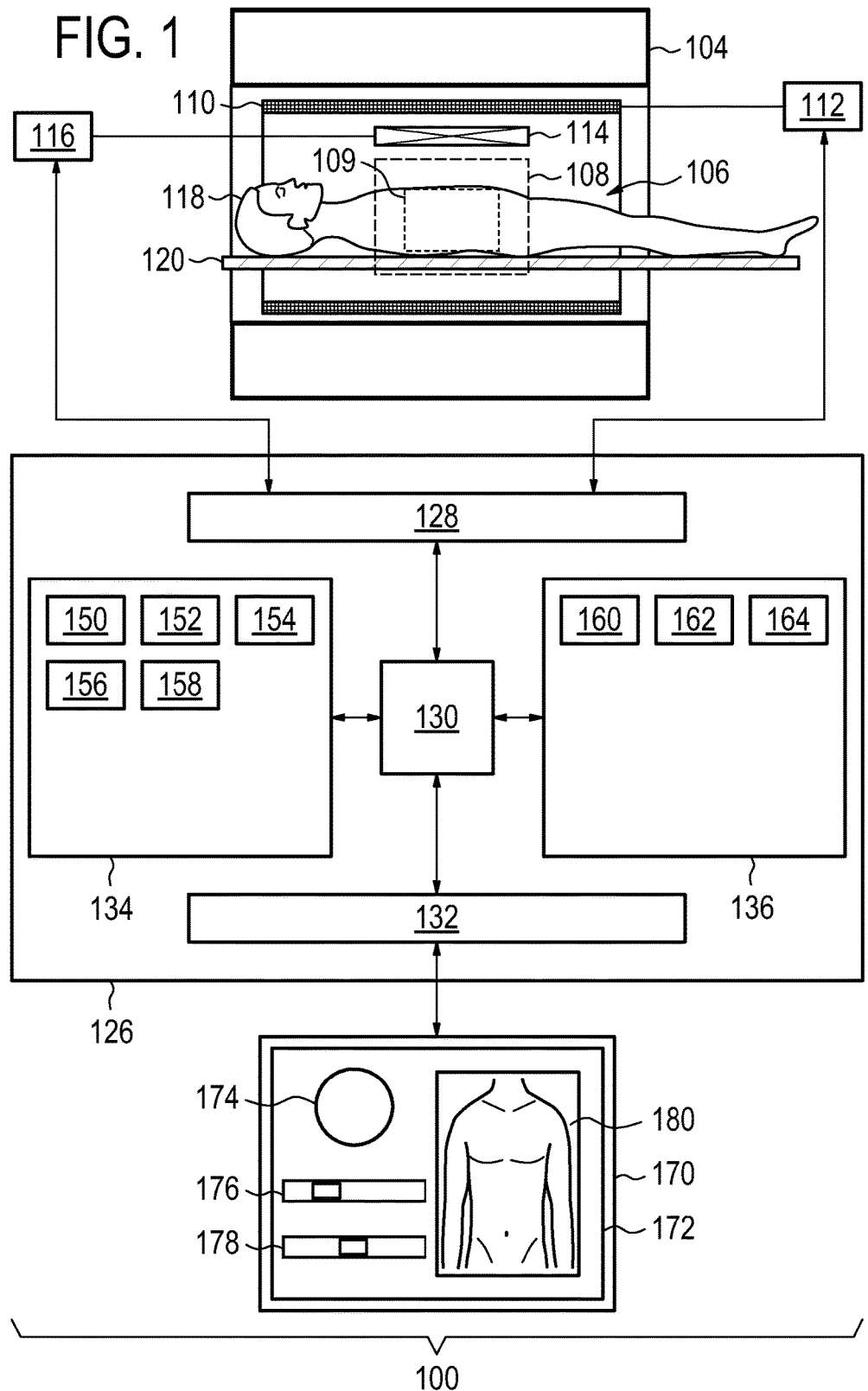
FIG. 1 illustrates an example of a magnetic resonance imaging system.

FIG. 1 illustrates an example of a magnetic resonance imaging system 100 according to an embodiment of the invention. The magnetic resonance imaging system 100 comprises a magnet 104. The magnet 104 is a superconducting cylindrical type magnet 104 with a bore 106 through it. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging.

Within the imaging zone is a field of view 109 where magnetic resonance data is collected from. Data is collected in k-space and then transformed into image space using a Fourier transform. The k-space data collected is therefore also descriptive of regions outside of the field of view.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils are unshielded magnetic gradient field coils. The magnetic field gradient coils 110 are connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientations of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receivers. The radio-frequency coil 114 may also have multiple receive/transmit elements and the radio frequency transceiver 116 may have multiple receive/transmit channels.

The magnetic field gradient coil power supply 112 and the transceiver 116 are connected to a hardware interface 128 of computer system 126. The computer system 126 further comprises a processor 130. The processor 130 is connected to the hardware interface 128, a user interface 132, computer storage 134, and computer memory 136.

The computer storage 134 is shown as containing a pulse sequence 150. The pulse sequence 150 contains instructions or data which may be converted into instructions which cause the magnetic resonance imaging system to acquire magnetic resonance data using a zero echo time magnetic resonance imaging method. The computer storage 134 is shown as further containing imaging magnetic resonance data 152. The imaging magnetic resonance data 152 was acquired with a subject at least partially in the imaging zone 108 and using the pulse sequence 150. The computer storage 134 is shown as containing an optional calibration magnetic resonance data 154. The calibration magnetic resonance data 154 was acquired using the pulse sequence 150 when the subject 118 was not within the bore of the magnet 106. The computer storage 134 is further shown as containing three-dimensional image data or three-dimensional image 156 that was reconstructed using the imaging magnetic resonance data 152. The computer storage 134 is further shown as containing a calibration image 158 that was reconstructed from the calibration magnetic resonance data 154.

The computer memory 136 is shown as containing a control module 160. The control module 160 contains code which enables the processor 130 to control the operation and function of the magnetic resonance imaging system 100. For example the control module 160 enables the processor 130 to use the pulse sequence 150 to acquire the magnetic resonance data 152, 154. The computer memory 136 is further shown as containing image reconstruction module 162 which enables the processor 130 to reconstruct the three-dimensional image data 156 from the imaging magnetic resonance data 152 and the calibration image 158 from the calibration magnetic resonance data 154.

The user interface 132 is shown as being connected to a display device 170. The display device could in one example be a monitor and a mouse or a touchpad for entering data and displaying data. In another example the display device 170 could be a separate computing device such as a tablet computer or so called smart phone. The display device has a display 172. On the display 172 is displayed a control element 174. The control element 174 is for instance a single button or control element which is operable for activating the acquisition of the magnetic resonance data. Selector 176 may be optional and may for instance be used for selecting the field of view of the acquired magnetic resonance data. For instance it may do so by image processing or it may also do so by changing the gradient duration or amplitude. Selector 178 may also be optional and for instance may be used to modify the image 180. It for instance may rotate the plane upon which data is projected onto. The display 172 also shows a region which displays a rendering 180 of the three-dimensional image data.

The computer storage 136 is shown as containing an image processing module 164. The image processing module may for instance be used for rendering the three-dimensional image data 156. For instance it may be used for projecting it onto a particular plane. The image processing module 164 may also be used to subtract the calibration image 158 from the three-dimensional image data 156 before rendering it.

Figure 2:
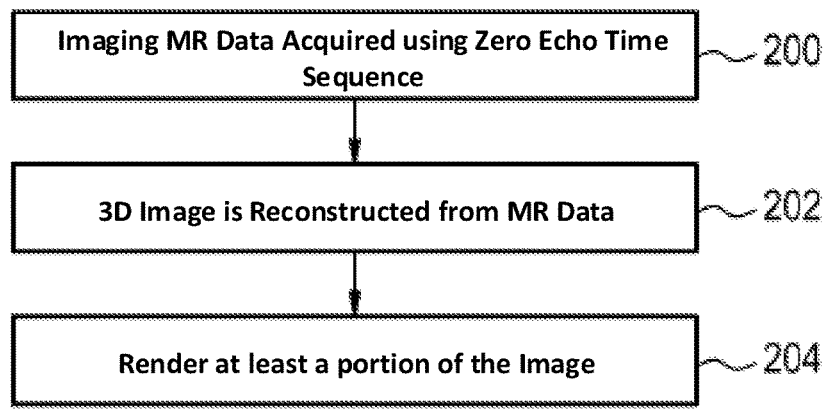
FIG. 2 shows a flow chart with an example of a method of operating the magnetic resonance imaging system of FIG. 1.

FIG. 2 shows a flowchart illustrating a method of operating the magnetic resonance imaging system 100 shown in FIG. 1. First in step 200 imaging magnetic resonance data 152 is acquired from a field of view 109 within the imaging zone 108 using the zero echo time pulse sequence data 150 to control the magnetic resonance imaging system 100. Next in step 202 a three-dimensional image 156 is reconstructed from the imaging magnetic resonance data 152. Finally in step 204 at least a portion of the three-dimensional image 156 is rendered on a display 172.

In the display 172 the rendering 180 may be done in a variety of ways. For instance the entire imaging magnetic resonance data may be projected onto a two-dimensional plane. In other instances a three-dimensional display such as three-dimensional television may be used to display the data three-dimensionally.

Figure 3:
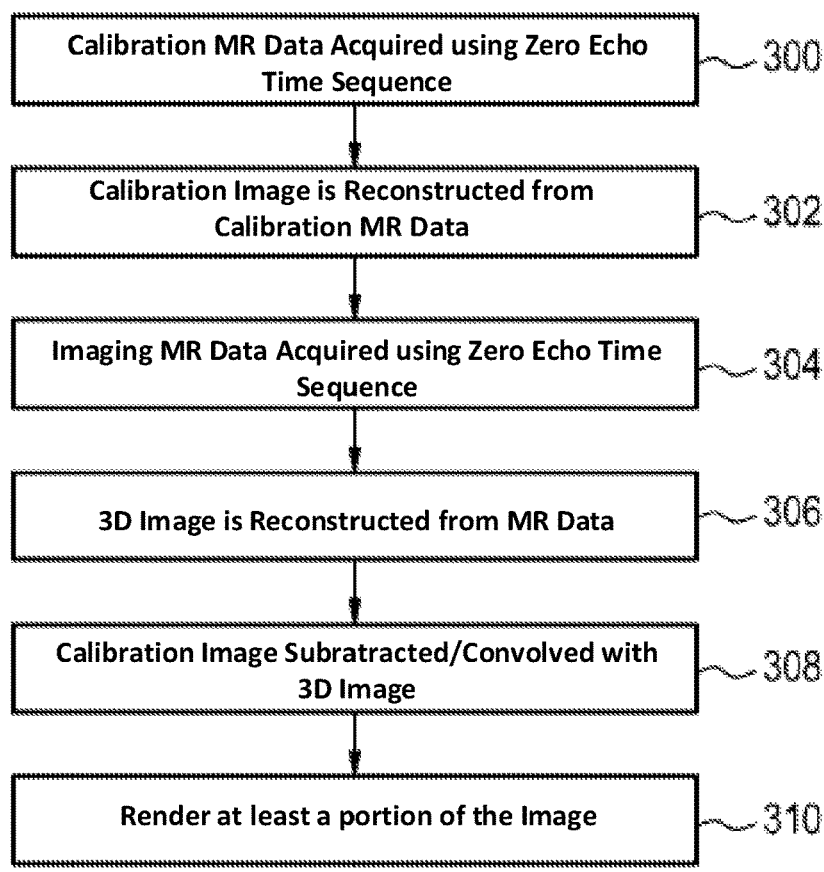
FIG. 3 shows a flow chart with a further example of a method of operating the magnetic resonance imaging system of FIG. 1.

FIG. 3 shows a flowchart which illustrates an example of a further method for controlling the magnetic resonance imaging system 100 shown in FIG. 1. First in step 300 calibration magnetic resonance data 154 is acquired from the field of view 109 within the imaging zone 108 using the zero echo time pulse sequence 150. The magnetic resonance imaging system is operable to acquire the magnetic resonance data without a subject in the imaging zone. When acquiring the calibration magnetic resonance data the subject is left out of the bore 106. Next in step 302 the calibration image 158 is reconstructed from the calibration magnetic resonance data 154. Then in step 304 imaging magnetic resonance data 152 is acquired from the field of view 109 within the imaging zone 108 using the zero echo time pulse sequence data 150 to control the magnetic resonance imaging system 100. Then in step 306 a three-dimensional image 156 is reconstructed using the imaging magnetic resonance data 152. In step 308 the calibration image is subtracted or convolved from the three-dimensional image 156. Then finally in step 310 at least a portion of the three-dimensional image is rendered on the display 172. It should be noted that the acquisition of the imaging magnetic resonance data or the calibration magnetic resonance data can be performed first. It does not matter in which order they are acquired.

The combination of a dedicated MR imaging technique together with a dedicated and substantially simplified MR system hardware design is shown in FIG. 1. To the extent that it achieves dedicated clinical application in cases currently performed using X-ray and CT. The nature of the combination of the specified imaging method and hardware design may realizes, in addition, substantially silent operation, significant system simplification, dramatic ease of use and substantially lower cost when compared to a conventional general purpose MRI system. The specific choice of imaging method lends itself to imaging bone and lung making it particularly attractive as a non-ionizing replacement for traditional X-ray (bones) and even CT (lungs) applications.

Examples may provide for a simplified MRI system that provides whole-body or dedicated limb images by utilizing a single, dedicated and substantially silent MR imaging method which is capable of generating proton density and/or T1 weighted images with sub millisecond echo time. The MRI system of the invention exclusively utilizes a single imaging technique that, by design, avoids the need for rapidly switched gradient fields and complex RF pulse shapes. The elimination of these stringent hardware requirements, as used in conventional MRI, allows for dramatic simplification of the gradient subsystem and the RF subsystem and data acquisition subsystems. As a consequence of the reduced hardware requirements a preferred embodiment of the MRI system of the invention utilizes an unshielded 3 axis gradient coil together with relatively low power gradient amplifiers. One of the consequences of this dramatic reduction in gradient power demand is a significant reduction in system cost and complexity. A further reduction in cost and complexity is realized as a result of the extreme simplicity of the RF pulses required in the dedicated imaging technique.

A suitable imaging technique, known as Zero Echo Time (ZTE) imaging, utilizes only short RF block pulses together with an uninterrupted 3D k-space trajectory facilitated by a gradient activation strategy that avoids both high slew rates and large steps in gradient amplitude. The ZTE scan is substantially silent in operation and yields high resolution images with extremely short echo time which are particularly advantageous for imaging both bone and lung tissue. As a consequence of the dedicated hardware and exclusive imaging method, the substantially cost reduced MRI system of the invention is intended for imaging primarily bones and broken bones as well as lungs and lung disease. These applications are typically performed using X-ray. However, X-ray uses ionizing radiation which can be harmful and undesirable, particularly in young patients and small children. The MRI system of the invention, as a consequence of its unique intended hardware simplification and it's dedicated, substantially silent, short echo time imaging technique is intended to substitute for an X-ray system in its ability to depict broken bones and bone disorders as well as applications and may be referred to by the acronym PXMR herein.

The substantially silent and short TE imaging method utilizes a 3D radial k-space trajectory which eliminates the need for either slice selection or off-center slice excitation. In fact, by constraining the imaging volume to always be a 3D volume with acquisition always around system iso-center, the need to utilize slice selective and frequency offset RF pulses is eliminated. This greatly simplifies the function and architecture of the RF transmit subsystem to delivering only short RF block pulses. The need to perform a scout image and slice position planning is also eliminated, thereby significantly simplifying operator workflow.

The PXMR system utilizes a single scanning sequence type for data acquisition. The ZTE imaging method is an example of such a method and is characterized by its use of short block RF pulses and a 3D radial k-space trajectory that avoids large gradient steps thereby rendering the acquisition process substantially acoustically silent.

Figure 4:
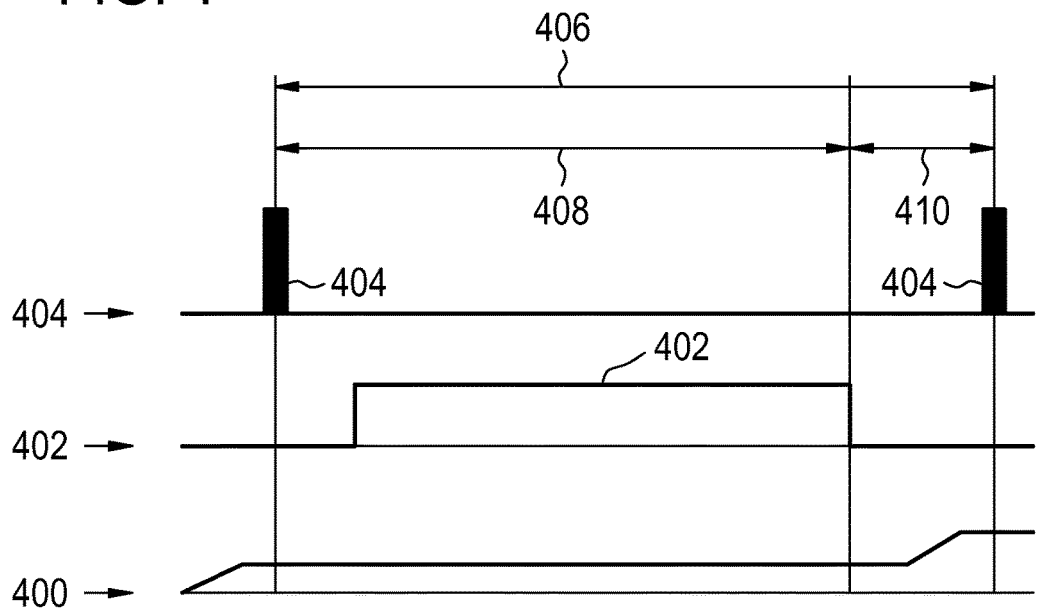
FIG. 4 illustrates an example of a zero echo time pulse sequence.

FIG. 4 shows a sketch of a zero echo time pulse sequence. The horizontal axis is time. Shown in this Fig. is the current supplied to one of the gradient coils and is labeled 400. The area 402 shows the time when acquisition of data is enabled. The timeline 404 shows when block RF pulses are performed. The duration labeled 406 is the repetition time or TR. The duration labeled 408 is the time when encoding 408 is performed. The block of time labeled 410 is a time when the gradient 400 is adjusted.

The following table shows a comparison between a convention MRI system and some possible features of PXMR systems.

| Property | Convention MR | PXMR |
|---|---|---|
| Gradient Coil | Shielded | Unshielded |
| Typical peak gradient amplitude | 40 mT/m | 15 mT/m |
| Typical peak gradient slew rate | 200 T/m/s | 1 T/m/s |
| Typical gradient amplifier power | >1000 kVA | ~5 kVA |
| RF pulse shapes | Shaped envelope | Block only |
| Signal localization | Slice selection | None (whole volume) |
| Imaging sequence types | Many | 1 |
| Image acquisition format | 2D and 3D | 3D only |
| k-space trajectory | Predominantly Cartesian | 3D radial silent |

The use of block RF pulses greatly simplifies the spectrometer. There is no requirement to generate shaped sinc-like RF pulses thereby eliminating the need for the necessary hardware and software. Since imaging will always be performed as a 3D volume around system iso-center there is no particular requirement to supply the functionality for excitation frequency offsets. The gradient slew rate requirements for PXMR are extremely low, around 1 mT/m, thereby eliminating the need to use shielded gradient coils. The low slew rate demand coupled with the use of unshielded gradient coils means that the gradient amplifier power can be reduced by several orders of magnitude compared to a conventional MRI system. The preferred static B0 field strength for the PXMR system can be between 0.5 T up to 1.5 T. Though this range is preferred, the method does not exclude higher or lower static field strengths. The ZTE method is particularly suited to imaging tissues with short T2 components.

Scan Parameters & Optimum B0

In the following example fixed scan parameters are assumed for both bone and lung imaging:
Field of View (FOV) (x,y,z): 500 mm Resolution: 1 mm (isotropic)
  The resultant TR for a ZTE like sequence utilizing a 5 µs duration block pulse is 1 ms.
  The maximum gradient amplitude required is 14 mT/m and slew rate is 0.4 T/m/s.
  The Ernst angles (yielding maximum signal amplitude) for bone and lung are 6.6 and 2.3 degrees respectively.
  A 3D volume scan under these circumstances can take between 2 to 3 minutes to acquire.
  Comparing the expected whole-body SAR as a function of static magnetic field strength yields the graph in FIG. 3.

It is advantageous to operate just below the first level controlled mode for whole-body SAR since this does not require medical supervision of the patient. The limit of the first level controlled mode for whole-body SAR is 2 W/kg.

Figure 5:
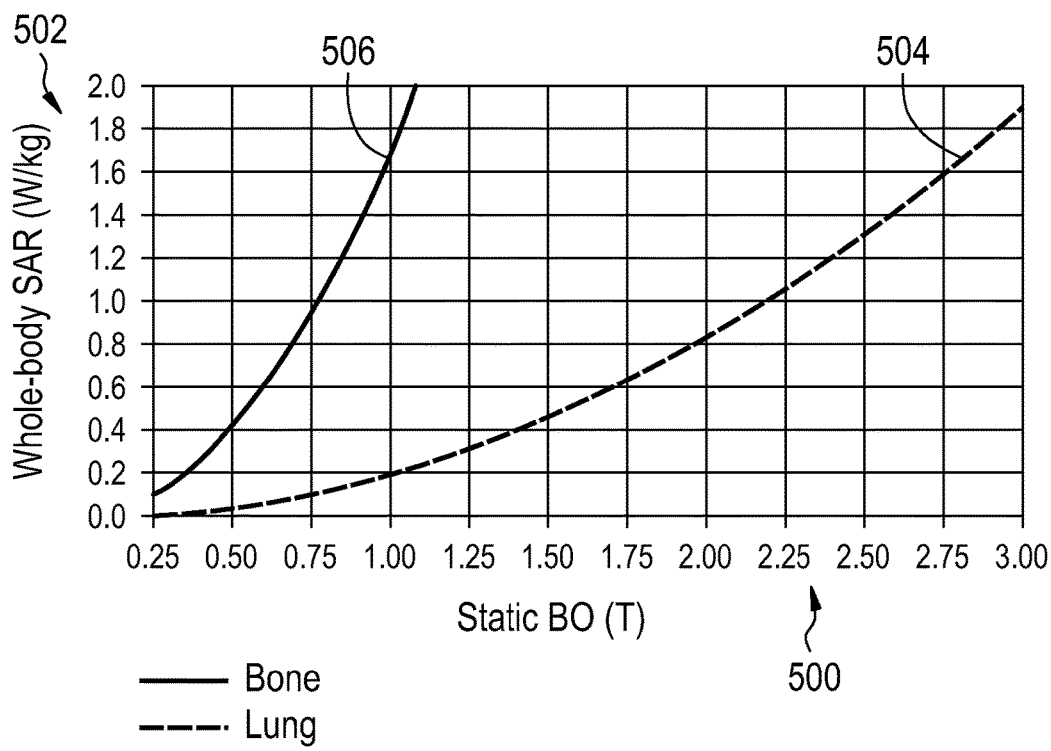
FIG. 5 shows a plot of whole-body SAR as function of BO for optimum bone and optimum lung scans.

FIG. 5 shows a plot of the whole-body SAR as a function of static field strength resulting from the ZTE scan parameters used for the defined fixed scan parameters. The line 504 represents the relationship in case of a lung scan while line 506 represents the relationship for a bone scan. The maximum field strength that realizes both scan types within the 2 W/kg whole-body SAR limit is 1.0 T. The whole-body SAR as function of BO for optimum bone and optimum lung scans is shown in FIG. 5 as described above.

Examples may have the following benefits:
  An MRI system dedicated to imaging bone and lungs suitable to replace typical X-ray applications while eliminating the ionizing radiation.
  A significant simplification and consequential cost reduction of the MRI system.
  Silent operation.
  Single scan type without the need to perform any planning enabling a true single push button.

Examples may have one or more of the following features:
1) A dedicated MRI system optimized for imaging bones and/or lungs and other clinical applications typically performed using X-ray.
2) Said MRI system utilizes a magnet which preferably operates at a static magnetic field strength of 1.0 T.
3) Said magnet can be a whole-body or dedicated limb magnet.
4) Said system utilizes an unshielded gradient coil and at least one transmit and receive RF coil.
5) Said gradient coil is energized by a gradient amplifier of substantially lower power than utilized in a conventional MRI system.
6) Said system optionally utilizes local transmit/receive RF coil arrays.
7) Said system utilizes a substantially silent 3D imaging method optimized for imaging tissues with short T2 components like bone and lung tissue.
8) Said system preferably operates always below the first level controlled mode for whole-body SAR.
9) Said system provides a single push button operation.
10) Said system does not require the operator to plan the imaging volume.
11) Said system utilizes non-slice selective block pulses exclusively.
12) A particular configuration of said system may utilize a shielded gradient coil.

When using ultra-short echo time (UTE) or Zero Echo Time (ZTE) pulse sequences there may be unwanted proton signal from materials used to make the magnetic resonance imaging system. The following examples and methods may provide a means of eliminating or removing this signal from a magnetic resonance image. The unwanted proton signal may be eliminated in methods that acquire MRI data with ultra-short or zero echo time. Typically the unwanted proton signal originates from the materials of the patient support and RF coil housing and components surrounding the patient FOV. A simple means to eliminate this unwanted signal is to acquire a reference scan without the patient present. This reference scan consists only of the unwanted proton signal. The reference scan data is subsequently subtracted from, or otherwise involved in the reconstruction of, the patient image resulting in a final image free from unwanted proton signal. The nature of UTE/ZTE methods is that they are inherently 3D acquisitions which lend themselves to correction using a similar 3D reference scan.

Human ZTE imaging has been demonstrated. Zero Echo Time (ZTE) imaging, utilizes only short RF block pulses together with an uninterrupted 3D k-space trajectory facilitated by a gradient activation strategy that avoids both high slew rates and large steps in gradient amplitude. The ZTE scan is substantially silent in operation and yields high resolution images with extremely short echo time which are particularly advantageous for imaging both bone and lung tissue. The substantially silent and short TE imaging method utilizes a 3D radial k-space trajectory which eliminates the need for either slice selection or off-center slice excitation. In fact, by constraining the imaging volume to always be a 3D volume with acquisition always around system isocenter, the need to utilize slice selective and frequency offset RF pulses is eliminated. This greatly simplifies the function and architecture of the RF transmit subsystem to delivering only short RF block pulses. The need to perform a scout image and slice position planning is also eliminated, thereby significantly simplifying operator workflow.

A problem with ZTE and similar ultra-short echo time imaging methods is that they are capable to image the protons within the plastic materials that make up the patient support and RF coil mechanics. Typically these materials and mechanics are rigid objects with predictable and constant shape and dimensions. This is particularly true for the patient support, system body coil and many local receive coils.

Examples may provide a means to acquire a complete 3D image covering the same resolution, FOV and contrast as the intended clinical scans, but without the patient in place. This can be done at installation and occasionally between patients. This proton calibration scan is stored and utilized during clinical image reconstruction. In the simplest approach the complex calibration image data is subtracted from the clinical scan complex image data to yield a clinical scan free of unwanted proton signal.

Other reconstruction approaches are possible, however, the essence of this invention is in acquiring and using the a priori information about the distribution and concentration of the undesired proton signal.

Imaging Technique:
The ZTE imaging method is characterized by its use of short block RF pulses and a 3D radial k-space trajectory that avoids large gradient steps thereby rendering the acquisition process substantially acoustically silent (cf. FIG. 4). The ZTE method has recently demonstrated whole-body imaging capability covering a large 3D volume with scan times on the order of a few minutes. Like all ultra-short echo time imaging techniques, the ZTE method also generates and measures unwanted proton signal from any surrounding material like RF coil housings and components.

The calibration procedure of the invention is performed without the patient. There is in addition to the desired proton signal from the patient, there is additional unwanted signal from components and structures of the RF coil and patient support.

The proton reference calibration data is acquired without the patient. This can be performed between patients when the system is normally idle or on a periodic basis depending upon the stability of the system. Correction of the actual clinical image data is performed by subtraction or by any other technique which makes use of the knowledge of the location and intensity of the unwanted proton signal.

A further refinement of the calibration procedure is to acquire the proton calibration scan with a variety of flip angles and TRs thereby enabling construction of a contrast model for the proton calibration data that can be used to optimize the correction step in the event that a different flip angle is used for the clinical acquisition.

Examples may have one or more of the following features:
1) A proton calibration procedure for ZTE/UTE imaging methods that facilitates elimination of unwanted proton signal from surrounding structures.
2) Said calibration procedure acquires data in a manner identical to the clinical protocol but minus the patient.
3) Said calibration procedure is performed on a periodic basis.
4) Alternatively, a proton calibration procedure that quantifies the MR relaxation properties of the material surrounding the patient and fits the properties to a contrast model that is then used to generate synthetic calibration data that can be manipulated in order to optimize artifact suppression from unwanted proton sources in clinical images.
5) A calibration procedure that can be performed before or after the patient has left the table.
6) A calibration procedure that also eliminates unwanted signal that is folded into the FOV of interest.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance imaging system
104 magnet
106 bore of magnet
108 imaging zone
110 magnetic field gradient coils
112 magnetic field gradient coil power supply
114 radio-frequency coil
116 transceiver
118 subject
120 subject support
126 computer system
128 hardware interface
130 processor
132 user interface
136 computer storage
138 computer memory
140 pulse sequence
142 magnetic resonance data
150 pulse sequence (zero echo time)
152 imaging magnetic resonance data
154 calibration magnetic resonance data
156 three dimensional image data
158 calibration image
160 control module
162 image reconstruction module
164 image processing module
170 display device
172 display
174 control element
176 selector
178 selector
180 rendering of three-dimensional image
400 gradient value
402 acquisition time
404 block RF pulse
406 TR repetition time
408 Encoding time
410 gradient adjustment time
500 Static Magnetic Field (BO) T
502 Whole body SAR W/kg
504 Lung tissue
506 Bone tissue

The invention claimed is:

1. A magnetic resonance imaging system, comprising:
a magnet for generating a main magnetic field with an imaging zone,
a gradient coil system configured to generate a gradient magnetic field within the imaging zone, wherein the gradient coil system comprises a set of unshielded gradient coils operable for generating the gradient magnetic field;
a memory configured to store machine executable instructions and pulse sequence data, wherein the pulse sequence data is descriptive of a zero echo time magnetic resonance imaging method;
a user interface with a single control element operable for activating the acquisition of the magnetic resonance data;
a processor for controlling the magnetic resonance imaging system, wherein execution of the instructions cause the processor to:
acquire imaging magnetic resonance data from a volume within the imaging zone using the zero echo time pulse sequence data;
reconstruct a three-dimensional image using the imaging magnetic resonance data; and
render at least a portion of the three-dimensional image on a display,
wherein a portion of the three dimensional image is rendered by projecting the three dimensional image onto at least one two-dimensional plane and
wherein execution of the instruction further causes the processor to acquire calibration magnetic resonance data from the volume within the imaging zone using the zero echo time pulse sequence, wherein the magnetic resonance imaging system is operable to acquire the calibration magnetic resonance data without a subject in the imaging zone;

reconstruct the calibration image using the calibration magnetic resonance data; and subtract or convolve the calibration image from the three dimensional image before rendering the at least a portion of the three dimensional image on the display.

2. The magnetic resonance imaging system of claim 1, wherein the user interface further comprises a field of view selector for adjusting the gradient magnetic field to contract or expand the volume.

3. The magnetic resonance imaging system of claim 1, wherein the processor is operable to acquire the calibration magnetic resonance data before or after acquiring the imaging magnetic resonance data.

4. The magnetic resonance imaging system of claim 1, wherein the magnet is operable for supporting a thorax of the subject into the imaging zone.

5. The magnetic resonance imaging system of claim 1, wherein the magnet is operable for supporting a portion of an extremity within the imaging zone.

6. The magnetic resonance imaging system of claim 1, wherein the magnet is a cylindrical magnet with a bore, wherein the bore has a diameter less than or equal to 25 cm or has a diameter less than or equal to 15 cm.

7. The magnetic resonance imaging system of claim 1, wherein the gradient coil system comprises a gradient coil power supply for supplying current to the set of unshielded gradient coils, wherein the slew rate of the unshielded gradient coils is less than 10 T/m/s or less than 1 T/m/S, and wherein the power requirements of the gradient coil power supply is less than 10 kVA or less than 5 kVA.

8. The magnetic resonance imaging system of claim 1, wherein the magnet is operable for generating the main magnetic field in the imaging zone with a field strength of less than or equal to any one of the following: 0.5 Tesla, 1 Tesla, and 1.5 Tesla.

9. The magnetic resonance imaging system of claim 1, wherein the user interface is operable for selecting a slice of the three dimensional image to render on the display.

10. The magnetic resonance imaging system of claim 1, wherein zero echo time pulse sequence data causes the processor to:

generate a series of constant gradient magnetic fields using the gradient coil system for radial center-out k-space encoding;

generate a block radio-frequency pulse corresponding to each of the series of constant gradient magnetic fields; and measure a portion of the imaging magnetic resonance data after the block radio-frequency pulse.

\* \* \* \* \*